United States Patent [19]

Zelez

[11] Patent Number: 4,504,519

[45] Date of Patent: Mar. 12, 1985

[54] DIAMOND-LIKE FILM AND PROCESS FOR PRODUCING SAME

[75] Inventor: Joseph Zelez, Tannersville, Pa.

[73] Assignee: RCA Corporation, New York, N.Y.

[21] Appl. No.: 548,040

[22] Filed: Nov. 3, 1983

Related U.S. Application Data

[62] Division of Ser. No. 348,021, Feb. 11, 1982, abandoned.

[30] Foreign Application Priority Data

Oct. 21, 1981 [GB] United Kingdom ............. 8131794

[51] Int. Cl.$^3$ .............................................. B05D 3/06
[52] U.S. Cl. .................................... 427/39; 423/445; 423/446; 423/458; 204/173; 428/408; 427/122; 427/249
[58] Field of Search ........... 423/445, 446, 448, 458; 427/39, 122, 249; 204/173; 428/408

[56] References Cited

U.S. PATENT DOCUMENTS

| 3,961,103 | 6/1976 | Aisenberg | 423/446 |
| 4,060,660 | 11/1977 | Carlson et al. | 427/39 |

FOREIGN PATENT DOCUMENTS

| 2736514 | 2/1978 | Fed. Rep. of Germany | 427/39 |
| 3030454 | 4/1981 | Fed. Rep. of Germany | 427/249 |
| 2069008 | 8/1981 | United Kingdom | 427/39 |
| 2082562 | 3/1982 | United Kingdom | 427/39 |
| 2083841 | 3/1982 | United Kingdom | 427/39 |

OTHER PUBLICATIONS

Berg et al., *Thin Solid Films,* vol. 58, pp. 117–120 (1979).
Holland et al., *Thin Solid Films,* vol. 58, pp. 107–116 (1979).
Ojha et al., *Thin Solid Films,* vol. 58, pp. 213–225 (1979).
Aisenberg et al., *J. Applied Physics,* vol. 42, No. 7, pp. 2953–2958, June 1971.

*Primary Examiner*—William R. Dixon, Jr.
*Assistant Examiner*—Steven Capella
*Attorney, Agent, or Firm*—Birgit E. Morris; Howard F. VanDenburgh

[57] ABSTRACT

An amorphous, carbonaceous, diamond-like film and a process for producing the same is disclosed. The film has an extremely low hydrogen content and an extremely low stress, is resistant to both acids and alkalis, and adheres tenaciously to many types of substrates including glasses, plastics, metals, and semiconductors. The process for producing this film is a hybrid process using radio frequency plasma decomposition of an alkane and a pair of spaced carbon electrodes.

7 Claims, No Drawings

DIAMOND-LIKE FILM AND PROCESS FOR PRODUCING SAME

This is a division of application Ser. No. 348,021, filed 2-11-82, abandoned.

This invention relates to an improved amorphous, carbonaceous, diamond-like film. Additionally, the invention pertains to an improved process for producing such an amorphous, carbonaceous film having diamond-like properties.

BACKGROUND OF THE INVENTION

Carbonaceous diamond-like film or films having diamond-like properties, such as the film of this invention, are well-known in the prior art. These films are particularly useful in applications such as the coating of optical lenses to increase the optical transmission through the lens and the coating of mirrors to improve the light reflectivity from the mirror. Such films also find useful applications as protective films in abrasive applications, such as the coating of writing instruments, as a general anti-reflective coating, and as a dielectric or protective coating for silicon and silicon-containing devices. In fact, the diamond-like films disclosed in this invention find many other useful applications in commerce and industry where films which are clear, extremely hard, extremely adherent, abrasion-resistant, corrosion-resistant, and which possess good optical properties, are needed.

While the amorphous, carbonaceous, diamond-like films of the prior art have much to commend them, the search has continued for improved amorphous, carbonaceous films having diamond-like properties. Particularly such a film having increased hardness and increased adherence to various substrates has continued to be sought, as well as a process for producing such a film.

The novel and improved carbonaceous diamond-like film of this invention is an improvement over presently-known films in that it has an extremely low stress, has the ability to tenaciously adhere to many, varied substrates, has a low hydrogen content, and is extremely hard.

SUMMARY OF THE INVENTION

With this invention, I have produced a novel and improved, amorphous, carbonaceous, diamond-like film which has an extremely low hydrogen content and an extremely low stress. This film is resistant to both acids and alkalis and has a hardness similar to that of diamond. The film has a refractive index, a dielectric constant, and a thermal coefficient of expansion similar to that of diamond. In addition, the film adheres well to many types of substrates, such as glasses, plastics, metals, semiconductors and the like.

DETAILED DESCRIPTION OF THE INVENTION

The improved amorphous, carbonaceous, diamond-like film of this invention, in addition to possessing the above-enumerated properties and qualities, differs from other presently-known carbonaceous films in that it possesses an extremely low hydrogen content; on the order of about one atomic percent or less of hydrogen. The prior art carbonaceous films contain hydrogen in an amount of up to about 25 atomic percent or more.

The diamond-like film of this invention additionally differs from prior art carbonaceous films in that it has an extremely low stress; the stress may be either a compressive or a tensile stress. The film of this invention exhibits a stress on the order of $10^7$ to $10^8$ dynes/cm$^2$, while the films of the prior art exhibit a stress on the order of $10^{11}$ dynes/cm$^2$. It is believed that the stress of these carbonaceous films is related to their hydrogen content, and that the lower the hydrogen content of the film, the lower the stress in the film. Due to the extremely low stress, the film of this invention is extremely adherent and adheres tenaciously to a great number and variety of substrates on which it is deposited.

The carbonaceous, diamond-like films of this invention are extremely resistant to acids, such as $H_2SO_4$, HF, HCl, and $HCl:HNO_3$, and alkalis such as NaOH, KOH, RbOH, and CsOH.

The amorphous carbonaceous diamond-like film of this invention is produced by a hybrid process in a deposition chamber using a radio frequency plasma decomposition from an alkane, such as n-butane, using a pair of spaced, generally parallel, carbon electrodes, preferably ultra pure carbon electrodes. While most films of this invention were deposited using normal butane, other alkanes, such as methane, ethane, propane, pentane, and hexane can be substituted in the process of this invention to produce the improved carbonaceous, diamond-like film thereof.

The deposition chamber, such as a stainless steel chamber, includes a pair of generally parallel and horizontal, vertically spaced, pure carbon electrodes with the substrate to be coated positioned on the lower carbon electrode. The electrodes are typically positioned about 2 up to about 8 centimeters apart from each other, with the preferred electrode spacing being approximately 2.5 centimeters. The chamber is evacuated to its ultimate pressure, generally in the region of about $10^{-7}$ torr, and then backfilled with an alkane, such as n-butane, to a pressure of approximately $8 \times 10^{-4}$ torr. Thereafter, the vacuum system is throttled to a pressure in the range of approximately 25 to 100 millitorr. After stabilization of the pressure, the radio frequency power is applied to the pair of pure carbon electrodes with the lower electrode (substrate target) being biased in the range of about 0 to about $-100$ volts, and the upper electrode being biased in the range of about $-200$ to about $-3500$ volts. Radio frequency plasma decomposition is begun, and an amorphous, carbonaceous, diamond-like film is deposited onto the substrate at rates varying between about 8 up to 35 angstroms per minute, to produce a film of up to about 5 micrometers in thickness.

The films produced by the above process have an extremely low stress. The stress for the films produced by the process has been measured and determined to be in the range of about $10^7$ to $10^8$ dynes/cm$^2$. As has been previously stated, the stress may be either a compressive or tensile stress. It has been determined that the resultant stress of the film produced by this process, be it either a compressive or tensile stress, is dependent on the potential applied to the upper carbon electrode.

The following specific examples are included in order to illustrate the invention and the improvements thereof with greater particularity. However, it is to be understood that these examples are not intended to limit the invention in any way.

EXAMPLE I

In this example, a stainless steel deposition chamber, as described above, was prepared for deposition of the improved carbonaceous diamond-like film of this invention. The deposition chamber was stabilized with n-butane at a deposition pressure of approximately 50 millitorr with the pair of ultra pure carbon electrodes being horizontally positioned and at a vertical spacing of approximately 6 centimeters from each other. A glass substrate for deposition of the film was positioned on the lower carbon electrode. The lower electrode (substrate target) was maintained at a potential of $-50$ volts and the upper electrode was maintained at a potential of $-500$ volts.

A film was then deposited by radio frequency plasma decomposition from n-butane onto the glass substrate under the above conditions at a rate of about 10 angstroms per minute to a thickness of approximately 1.45 micrometers. The stress of the resulant film was measured and determined to be a stress of about $7 \times 10^8$ dynes/cm$^2$, tensile stress. The resultant film had a hydrogen content of less than 1.0 atomic percent.

In a similar experiment, it was determined that when the potential of the upper electrode was decreased and maintained at a $-300$ volts, while maintaining the potential of the lower electrode (substrate target) at $-50$ volts, the film deposited under such conditions at a rate of approximately 10 angstroms per minute to a thickness of 1.5 micrometers had a compressive stress. The stress of the film in this experiment was measured and determined to be about $8 \times 10^8$ dynes/cm$^2$, compressive stress. The hydrogen content of the film obtained in this experiment was measured and determined to be less than 1.0 atomic percent hydrogen.

In a series of additional experiments, similar to the above, improved carbonaceous diamond-like films, like the above, were deposited on other substrates. These substrates included metals, such as stainless steel, molybdenum, tungsten, and tantalum; various glasses, silicon, silicon dioxide, and aluminum oxide, as well as plastics, such as polycarbonate, styrene, acrylic, styrene/acrylic copolymer, and other resins.

EXAMPLE II

In this example, a series of experiments were performed as in Example I to deposit the improved carbonaceous, diamond-like film of this invention under a variety of potentials applied to the upper electrode and lower electrode or substrate target. The voltages employed and the results obtained in each of these experiments are set forth hereinbelow:

The hydrogen content of the above films was measured and determined to be less than 1.0 atomic percent hydrogen.

EXAMPLE III

In this example a number of high quality plastic lenses were coated with the improved carbonaceous, diamond-like film of this invention using the stainless steel deposition chamber and process of this invention as described in Example I. After evacuation, the chamber was backfilled with normal butane and stabilized at a deposition pressure of approximately 80 millitorr. The pair of ultra pure carbon electrodes were positioned at a spacing of about 2.5 centimeter with the plastic lens to be coated positioned on the lower electrode. This lower electrode (substrate target) was maintained at a potential of $-50$ volts while the upper electrode was maintained at a potential of $-2500$ volts. A film was then r.f. plasma deposited onto the plastic lens under these conditions at a rate of approximately 25 angstroms per minute to a thickness of 1100 angstroms. Another lens was coated on both of its sides with the film of this invention, with the film on each side having a thickness of 1100 angstroms. A third plastic lens was coated on one side with the film of this invention to a film thickness of 11,000 angstroms. In all cases, the films of this example exhibited the same low stress and low hydrogen content as the films produced in the previous examples set forth above. Additionally, the optical properties (absorption, transmission, and reflection) of the coated plastic lenses were maintained at approximately the same level, and in many cases these optical properties were improved by the film of this invention having been coated on their surface.

I claim:

1. A process for depositing an amorphous, carbonaceous film having a stress below $10^{10}$ dynes/cm$^2$ and a hydrogen content of one or less atomic percent on a substrate in an evacuated deposition chamber having an internal pair of substantially horizontal and parallel, vertically spaced carbon electrodes, and means for applying radio frequency power to said pair of electrodes; comprising the steps of:
    (a) positioning said substrate on the lower electrode of said pair of electrodes;
    (b) stabilizing the pressure within said deposition chamber with a lower alkane containing from 1 up to about 6 carbon atoms at a pressure of from about 25 up to about 100 millitorr;
    (c) applying radio frequency power to said pair of electrodes; and
    (d) biasing the upper electrode of said pair in the range of from about $-200$ to about $-3500$ volts and said lower electrode in the range of from about

| No. | Upper Electrode Potential - Volts | Lower Electrode (Substrate Target) Potential - Volts | Film Thickness (Micrometers) | Film Stress (T-Tensile, C-Compressive) dyne/cm$^2$ |
|---|---|---|---|---|
| 1 | $-450$ | $-50$ | 1.44 | $7.01 \times 10^7$ (T) |
| 2 | $-450$ | $-50$ | 0.72 | $2.80 \times 10^7$ (T) |
| 3 | $-450$ | $-50$ | 1.50 | $1.97 \times 10^7$ (T) |
| 4 | $-400$ | $-50$ | 0.42 | $3.22 \times 10^8$ (T) |
| 5 | $-400$ | $-50$ | 2.75 | $9.02 \times 10^8$ (T) |
| 6 | $-400$ | $-50$ | 0.82 | $9.61 \times 10^8$ (T) |
| 7 | $-350$ | $-50$ | 0.25 | $5.95 \times 10^8$ (T) |
| 8 | $-350$ | $-50$ | 1.00 | $1.15 \times 10^8$ (T) |
| 9 | $-300$ | $-50$ | 0.22 | $1.52 \times 10^8$ (C) |
| 10 | $-250$ | $-50$ | 0.18 | $3.91 \times 10^8$ (C) |
| 11 | $-250$ | $-50$ | 0.08 | $7.45 \times 10^8$ (C) |

0 to about −100 volts, whereby said film deposits on said substrate by radio frequency plasma decomposition of said lower alkane.

2. A process as defined in claim 1 wherein said spacing of said parallel electrodes is from about 2 up to about 8 centimeters.

3. A process as defined in claim 1 wherein said vertical spacing of said pair of electrodes is from about 2.5 to about 6.0 centimeters.

4. A process as defined in claim 1 wherein said deposition chamber is stabilized at a pressure of from about 35 up to about 85 millitorr.

5. A process as defined in claim 1 wherein said lower alkane is n-butane.

6. A process as defined in claim 1 wherein said upper electrode is biased in the range of from about −250 to about −2500 volts.

7. A process as defined in claim 1 wherein said lower electrode is biased in the range of from about −25 to about −75 volts.

* * * * *